United States Patent
Rumsby (10) Patent No.: US 8,729,426 B2
(45) Date of Patent: May 20, 2014

(54) METHOD AND APPARATUS FOR LASER MACHINING RELATIVELY NARROW AND RELATIVELY WIDE STRUCTURES

(75) Inventor: Philip Thomas Rumsby, Bladon (GB)

(73) Assignee: M-Solv Ltd., Oxford (GB)

( * ) Notice: Subject to any disclaimer, the term of this patent is extended or adjusted under 35 U.S.C. 154(b) by 399 days.

(21) Appl. No.: 13/139,136

(22) PCT Filed: May 27, 2009

(86) PCT No.: PCT/GB2009/001322
§ 371 (c)(1),
(2), (4) Date: Jul. 7, 2011

(87) PCT Pub. No.: WO2010/067042
PCT Pub. Date: Jun. 17, 2010

(65) Prior Publication Data
US 2011/0259631 A1    Oct. 27, 2011

(30) Foreign Application Priority Data

Dec. 13, 2008  (GB) .................................. 0822755.5
Mar. 26, 2009  (GB) .................................. 0905171.5

(51) Int. Cl.
| B23K 26/06 | (2006.01) |
| B23K 26/067 | (2006.01) |
| H01K 3/10 | (2006.01) |
| H05K 3/06 | (2006.01) |

(52) U.S. Cl.
USPC ............. 219/121.68; 219/121.69; 219/121.7; 219/121.71; 29/846; 216/13

(58) Field of Classification Search
USPC ............. 219/121.68–121.71, 121.76, 121.85; 29/846; 216/13; 427/554, 555
See application file for complete search history.

(56) References Cited

U.S. PATENT DOCUMENTS

2007/0163887 A1 *  7/2007  Hofmann ........................ 205/80
2008/0145567 A1    6/2008  Ohmae et al.

FOREIGN PATENT DOCUMENTS

EP    1 709 849    8/2007

OTHER PUBLICATIONS

International Search Report issued in PCT Application No. PCT/GB2009/001322 dated Sep. 18, 2009.
Huemoeller R., et al. "Unveiling the next generation in integrated circuit substrate circuit formation" Circuitree Business News Publishing Co. USA, vol. 20, No. 6, Jun. 2007.

* cited by examiner

Primary Examiner — Samuel M Heinrich
(74) Attorney, Agent, or Firm — KED & Associates, LLP (57) ABSTRACT

The method uses a common optical, system and sequentially creates structures of different sizes in a polymer substrate by means of different laser processes is described. One process uses a laser beam that is tightly focussed on the substrate surface and is used for creating fine groove structures by semi-continuous direct write type beam movement. The second process uses a second laser beam that is used to form a larger size image on the substrate surface and is used to create blind pads and contact holes in the substrate in step and drill mode. A third optional process uses the second laser beam operating in direct writing mode to remove layers of the substrate over larger continuous areas or in a mesh type pattern.

20 Claims, 6 Drawing Sheets

METHOD AND APPARATUS FOR LASER MACHINING RELATIVELY NARROW AND RELATIVELY WIDE STRUCTURES

TECHNICAL FIELD

This invention relates to a method and apparatus for laser machining structures of different widths in a dielectric substrate. It is particularly relevant to the sequential formation of narrow groove or trench structures and larger area pad and blind contact holes and/or ground-plane structures in the top surface of a layer of polymer for the purpose manufacturing micro-electronic circuits.

BACKGROUND ART

Lasers are widely used in the manufacture of advanced printed circuit boards (PCBs). A particularly well known example is the drilling of blind contact holes, so called microvias, in multi layer PCBs. In this case ultra violet (UV) lasers are often used to drill through a top copper layer and an underlying dielectric layer to allow contact to, be made to a lower copper layer. In some cases, the cost effectiveness of this process is improved by using two different laser processes to remove the two different materials. A UV diode pumped solid state (DPSS) laser is usually used to drill the holes in the top copper layer to expose the lower dielectric layer and in a separate process a CO2 laser is used to remove the dielectric material exposed below each hole. Such a two stage laser process can have many economic advantages as each process can be optimized separately. In such a case, however, because of the very different optical requirements, two physically separated optical systems are used and the substrate has to be moved, between the two systems to enable the second process to be performed.

Recently a new type of high density multi-layer circuit board manufacturing technology has been proposed. US2005/0041398A1 and publication "Unveiling the next generation in substrate technology", Huemoeller et al, 2006 Pacific Micro-electronics Symposium describe the concept of "laser-embedded circuit, technology". In this new technology lasers are used to directly ablate fine grooves, larger area pads and also blind contact holes in organic dielectric substrates. The grooves connect to the pads and contact holes so that after laser processing and subsequent metal plating a complex pattern of fine conductors and pads embedded in the top surface of the dielectric layer is formed together with deeper contact holes connecting to a lower metal layer. Up to now pulsed UV lasers have been used to form the grooves, pads and contact holes in a single process using either direct write or mask imaging methods.

The direct write approach generally uses a beam scanner to move a focussed UV laser beam over the substrate surface to scribe the grooves and also create the pad and contact hole structures. This direct write approach uses the highly focusable beam from UV lasers with high beam quality and hence is very well suited to the fine groove scribing process. It is also able to deal well with the different depth requirements associated with pad and contact hole structures. By this method, grooves, pads and contact holes of different depth can be readily formed. However, because of the limited laser power available from highly focusable UV laser, this direct write process is slow when it comes to removing the more substantial volume of material associated with the larger area pads and contact holes. This direct write method also has difficulty maintaining constant depth at the intersections between grooves and pads.

The mask imaging approach uses an excimer laser to illuminate a mask containing the full detail of the circuit design. An image of the mask is projected onto the substrate and the mask and substrate are moved together to allow the full area of the circuit to be reproduced on the substrate. Since the whole area of the mask is scanned during the image transfer process, this approach is insensitive to the area of the structures to be created and hence is well suited to creating both the fine grooves and also the larger area pads. It is also excellent at maintaining depth constancy at the intersections between grooves and pads. However, except in the case where the circuitry is extremely dense, this mask imaging is approach is significantly more costly than the direct write approach since the purchase and operating costs of excimer lasers are both very high. Mask imaging is also very inflexible in that a new mask needs to be manufactured each time a new circuit design is required. In addition, excimer laser mask projection is not well suited to creating structures of different depth as required especially for the contact holes.

This later limitation is overcome in the invention described in publication US 2008/0145567 A1. In this case, an excimer laser scanning mask projection system is used to simultaneously form grooves and pads to the same depth in the insulating layer and, in a separate process, using a second laser which is delivered by a separate beam delivery system, the deeper contact holes penetrating to an underlying metal layer are formed. This two step process is an effective way of dealing with the varying depth structure requirements but still suffers from the high cost and poor flexibility associated with the use of masks and excimer lasers.

Hence, it can be seen that the existing process methods for making advanced circuits based on this "laser-embedded circuit technology" have serious disadvantages. There remains a need to be able to use laser processes that are separately optimized for creating the different size and depth structures required in a very flexible way, to improve the process rate and reduce the cost. The present invention aims to provide a multistage stage process that avoids the use of large area masks and costly excimer lasers yet addresses these needs.

DISCLOSURE OF INVENTION

According to a first aspect of the invention, there is provided apparatus for the formation by laser ablation of relatively narrow grooves and relatively wide areas and/or holes in the surface of a dielectric layer comprising:

laser apparatus for providing a first laser beam that is strongly absorbed by the dielectric layer and has substantially diffraction limited beam quality and which, operates continuously or quasi-continuously for direct writing of the grooves and a second laser beam that is strongly absorbed by the dielectric layer and which operates in pulsed mode for forming the areas and/or holes via an image of an aperture or mask or via focal spot shaping;

a common optical path comprising a beam scanner for deflecting the first and second laser beams in two orthogonal axes relative to the dielectric layer and a lens for focussing the first laser beam onto the surface of the dielectric layer and, when the second laser beam is used, for forming an image of said aperture or mask on the surface of the dielectric layer or for forming a shaped focal spot on the surface of the dielectric layer;

and a control system arranged, in a first step, to drive the beam scanner so that a focussed spot of the first laser beam is moved so as to vaporize the dielectric material to form relatively narrow grooves in the surface thereof and, in a second step, to drive the beam scanner so that a relatively wide laser spot from the second laser beam is incident on the surface of the dielectric layer and is moved to form relatively wide areas of defined depth in the surface thereof and/or is moved between a series of defined locations and the second laser beam held stationary at each location and a burst of laser pulses of sufficient number and energy is fired such that the dielectric material is vaporized to form a relatively wide hole of defined depth.

According to a second aspect of the invention, there is provided a method of forming relatively narrow grooves and relatively wide areas and/or holes in the surface of a dielectric layer by laser ablation comprising:

providing a first laser beam that is strongly absorbed by the dielectric layer and has substantially diffraction limited beam quality and which operates continuously or quasi-continuously to directly write the grooves and providing a second laser beam that is strongly absorbed by the dielectric layer and which operates in pulsed mode to form the areas and/or holes via an image of an aperture or mask or via focal spot shaping;

providing a common optical path comprising a beam scanner to deflect the first and second laser beams in two orthogonal axes relative to the dielectric layer and a lens to focus the first laser beam onto the surface of the dielectric layer and, when the second laser beam is used, to form an image of said aperture or mask on the surface of the dielectric layer or to form a shaped focal spot on the surface of the dielectric layer;

and providing a control system which, in a first step, drives the beam scanner so that a focussed spot of the first laser beam is moved so as to vaporize the dielectric material to form relatively narrow grooves in the surface thereof and, in a second step, drives the beam scanner so that a relatively wide laser spot from the second laser beam is incident on the surface of the dielectric layer and is moved to form relatively wide areas of defined depth in the surface thereof and/or is moved between a series of defined locations, the second laser beam being held stationary at each location and a burst of laser pulses of sufficient number and energy is fired such that the dielectric material is vaporized to form a relatively wide hole of defined depth.

This invention is thus based on the sequential use of two different laser beams using different beam motion and process methods in order to enable interconnected structures of different shapes, depths and sizes to be created in the surface of a dielectric layer. Both laser beams are delivered to the substrate through a common optical path so that motion of the substrate between processes is unnecessary. Narrow groove structures having a depth less than the full depth of the polymer layer are formed with the first laser beam in a first laser process following which the relatively wide features such as pads and contact holes are formed in a second separate laser process using the second laser beam. The pads formed in the second process all have a depth less than the full depth of the polymer layer the depth, being generally being similar to the grooves, while the contact holes or vias are substantially deeper and generally extend to a metal layer under the polymer layer. Alternatively, or in an additional third process step, the second laser beam can be used to form mesh-type or continuous ground-plane structures over relatively large areas of the substrate. The depth of these ground-plane structures is generally similar to the depth of the fine grooves and pads. The term 'relatively wide areas and/or holes' is used herein to include pads, contact holes, vias and ground plane structures as described above.

The first important feature is that fine scale groove-type structures are first created in the substrate surface using a direct write approach. In this case, the laser beam is focussed by a lens to a small spot which is moved in a series of continuous paths to vaporize the polymer dielectric to form the required number of discrete lengths of groove. The laser beam should be of substantially diffraction limited quality.

The groove width and beam speed requirements dictate that the laser used for this direct write grooving process must operate either continuously or if pulsed must have a repetition rate that exceeds some minimum value. In an extreme case, the groove width may be as small as 10 µm and up to 10 laser pulses may be required to remove material to the depth required and if beam speeds up to several metres per second are used pulsed laser repetition rates exceeding several MHz are needed. For wider grooves, lower repetition rates are acceptable. It is generally required that the depth of the groove is maintained constant along its length and hence the laser beam repetition rate must be sufficiently high that the distance traveled by the beam over the substrate between pulses is substantially less than the groove width. In general, it is likely that repetition rates exceeding a few 100 kHz will be required.

Ideal lasers for this direct write grooving process operate either continuously (CW lasers) or operate at such a high repetition rate that they behave like CW lasers. Such lasers are called quasi-continuous (QCW) and generally operate at repetition rates in the 80 to 120 MHz range.

A second important feature is that after the laser grooving process has been completed, larger scale structures such as pads and blind contact holes are created in the substrate surface using a "step and drill" process using a pulsed laser. In this case, rather than focussing the laser beam, an imaging method is used to form a laser spot of the required size on the substrate surface. An aperture or mask is placed in the beam after the laser and this aperture is imaged by a lens onto the substrate to form a laser spot of well defined shape. The beam is held stationary at the required pad or contact hole location and a "burst" of laser pulses are fired to remove material to the required depth. The depth of pad or contact hole is generally an approximately linear function of the number of laser pulses. After a pad or contact hole is drilled, the beam is moved to the next location and the process repeated. Beam shaping can also be used instead of imaging an aperture or mask.

Such a mode of operation requires a laser that can emit sufficient energy per pulse to create an energy density on the substrate surface that exceeds the ablation threshold by some margin. In an extreme case, pad diameters up to 0.3 mm may be required with energy densities of several J/cm2. Such a requirement leads to a need for a laser beam containing up to several mJ in each pulse. For smaller pads and contact holes correspondingly less energy per pulse is required. In general, the minimum pulse energy requirement is likely to be a few tens of µJ.

Lasers used for this "step and drill" imaging mode process operate in pulsed mode where the pulses are emitted in a series of "bursts", each burst containing a limited number of pulses. Suitable lasers can be of high beam quality with highly focusable beams but the use of lasers with lower beam quality, so called multi-mode lasers, is preferred since these operate at much higher power levels. Since each drilling operation needs to be accomplished as rapidly as possible, the repetition rate needs to be as high as practicable consistent with the ability to deliver sufficient pulse energy. Repetition rates in the few kHz up to about 10 kHz range are envisaged as most appropriate for this process. Such repetition rates are likely to require lasers with powers in the range of a few tens of Watts up to many tens of Watts are required.

Another important feature is that the pulsed laser can instead, or more likely in addition, be used for a third process whereby the large area focal spot is moved over the substrate surface in a direct write mode to in order to remove material to a uniform depth over a large continuous area or to create a 2D mesh type structure consisting of orthogonal arrays of crossing parallel lines of wide grooves in order to form ground planes in the electronic circuit layer. As an alternative to a mesh consisting of continuous wide grooves that cross with the pulsed laser, it is possible to create a 2D mesh structure consisting of a pattern of touching pads. Such a structure can be created by continuously moving the beam over the substrate and firing laser pulses at the times that correspond to the required positions of the pads in order to make the pad boundaries touch. Several laser pulses are generally required at each position to remove material to the required depth so for this to be achieved the pattern is repeated multiple times.

In general, two different lasers will be used sequentially for the different processes of grooving and pad, contact hole or ground plane formation, but, in some cases, it may be appropriate to use a single laser that can operate satisfactorily in both modes. Such a laser needs to operate with high beam quality at high repetition rate or in CW mode so that is able to form narrow grooves at high beam speed and also operate at lower repetition rate with significantly higher energy in each pulse for the formation of pads and contact holes.

Clearly, a very important characteristic of the lasers used for this dual process is that they must operate at a wavelength that is strongly absorbed in the dielectric material. Alternatively, in the case of pulsed lasers, in some situations these may operate at a wavelength outside that which is strongly absorbed by the dielectric material so long as the laser pulse duration is sufficiently short such that the intensity of radiation in the focal spot is sufficiently high to cause the beam to be absorbed by non-linear processes.

Another important feature is the method used to move the beams over the substrate surface. The simplest method to move the laser beams is by motion of the substrate in two axes under a stationary lens. This method is generally slow and therefore the preferred method is to use a two axis beam scanner unit to deflect the beams rapidly in two orthogonal directions. Such scanner units are very well known and are generally used with a lens situated after the scanner. In this case, so called f-theta lenses are often used since this type of lens is designed to operate in this mode and create as far as is possible a focal spot of constant size and shape over a flat field. In some cases, however, it may be appropriate to use a lens situated before the scanner unit. Such an arrangement generally gives rise to a curved focal plane and in this case the use of a dynamic variable telescope situated before the lens to adjust the focal plane is common. The use of a dynamic variable telescope with an f-theta lens situated after the scanner is also possible. Such arrangements with a dynamic variable telescope are usually referred to as three axis scanners.

Another important feature is that the beams for the different laser processes are delivered to the substrate through a common optical path. For the case where two separate lasers are used for the different processes, it is necessary to combine the beams alternately into the common beam path consisting of the scanner and the lens. One way to do this utilizes a moving mirror that is switched into one of the beam paths in order to inject the other beam. An alternative way utilizes the fact that generally most laser beams are polarized. In this case, the mirror remains in position in one of the beams at all times. The mirror has a special dielectric coating that reflects preferentially a beam of one polarization and transmits preferentially a beam of the orthogonal polarization. In this case, the first and second beams are arranged to have orthogonal polarizations at the beam combining mirror. Such polarization based beam combining methods are well known.

In both beam combining methods, the two separate beams are adjusted to be spatially coincident at the surface of the mirror and the angle of the mirror is adjusted to ensure both beams propagate through the scanner and lens without any angular offset. This ensures that the focal spot generated by the first beam is coincident with the imaged spot generated by the second beam at the substrate surface.

The arrangement where two separate lasers are used is convenient as each path can be optically conditioned before the beams are combined. It is desirable that the beam from the laser generating the first beam for grooving has telescopic optics in its beam path to change the beam diameter so that the focal spot generated on the substrate surface is of the correct diameter. It is also desirable that the beam from the laser generating the second beam for pad and contact hole drilling and ground plane formation has separate telescopic optics in its beam path to change the beam diameter to match the size of the imaged aperture. With separate beam paths, the aperture can be permanently installed in the beam path and adjusted to be coaxial with the beam. In addition, further optics can be installed in the second beam path after the aperture to condition the beam to allow the image of the aperture to fall in exactly the same plane as the focus of the first beam so avoiding the need to make any corrections when switching between the two process modes.

For the case where a single laser is used to alternately generate the first and second beams, however, such independent beam conditioning is not possible and mechanical movement of any beam size changing optics, the aperture (or beam shaper) and its associated optics in and out of the common beam path are necessary.

A further important feature is that, since the drilling process with the second beam uses an imaging process, the shape and size of the blind pads and contact holes produced on the substrate are defined accurately by the shape and size of an aperture situated in the beam at the object plane corresponding to the image on the substrate. In general, it is expected that in most cases the pads and contact holes will be circular in shape and therefore a circular aperture is used in the beam path. Apertures of any shape, however, can be used in order to create pads and contact holes of non circular shape.

Apertures can consist of a simple metal plate with a hole or may be made of a transparent substrate with a patterned opaque coating. Such a substrate based device is termed a mask. Such masks can contain complex structure if required. For example, a mask with a circular aperture in the opaque coating might contain an opaque region in the centre. Such a mask would give rise to a pad with annular shape on the substrate. It is also possible to envisage masks that have variable transmission of the beam within a region. The use of such masks would give rise to images on the substrate containing area of different energy density and hence different depths after laser vaporization.

In general, the imaging optical system used de-magnifies the aperture or mask onto the substrate so that higher energy densities can be achieved on the substrate without risk of damage to the mask or aperture. Typical pad and via sizes are from a few 10s of microns up to a few 100s of microns in diameter. Typical aperture dimensions may be up to a few mm in diameter so demagnification ratios from a few to 10 or even more are generally used.

Since pads and contact holes of different size are required even within individual circuits, it is desirable that the aperture size can be readily changed. For the case where the second laser beam is used to form large area ground plane structures, it may be desirable to remove the aperture entirely. This change of aperture size or aperture removal is accomplished by the use of motorized variable iris if the aperture is circular or by the use of a motorized mask or aperture changer unit. Such motorized devices are well known.

Another option is to use a beam shaper, e.g. a diffractive optical element (DOE) to shape the focal spot formed on the substrate.

A particularly important feature of the apparatus and method described is that it is well suited to controlling the depth of the structure in the regions where pads and fine grooves intersect. It is important from the point of view of the electrical performance of embedded conductor based circuits that the depth of the grooves is substantially similar to the depth of the pads and that the depth in the intersection region is not significantly different to either the pad or groove. To achieve this using a direct write approach for both grooves and pads is very difficult since, with such an arrangement, there are many regions where the focal spot trajectory has to stop and start and highly accurate control of beam position and power is necessary. With the dual process method described herein, the degree of control of beam position required in the pad and groove intersection regions is significantly relaxed. In general, it expected that for each circuit the fine grooving process will take place before the pad and contact hole drilling and ground-plane forming processes but this is not essential.

Care has also to be taken to maintain constant depth of material removal when using the second, pulsed laser beam for the formation of large continuous area or mesh type ground-planes. For structures that are wider than the focal spot, this is achieved by careful control of the overlap of the laser spots on the substrate surface in 2 dimensions.

Uniformity of depth control is often assisted by the use of laser spots that are Gaussian in profile or are closer to top hat profile but have so called "soft edge's". These "soft edged" spots are readily generated by the use of a multimode laser. The same laser can be readily used to create both the pad and contact hole structures and the ground planes. In the case of the pads and contact holes, the aperture is inserted into the beam to create a spot with sharp edges on the substrate. For ground plane structures where a soft edged spot is preferable, the aperture can be of "apodized" type having variable transmission at the perimeter to form a soft edge. Alternatively, if the raw beam from the laser has a suitable profile, the aperture can be withdrawn. Another method that can be used to form a soft edged spot for ground plane structure formation without removing the hard edged aperture used for pads and contact holes is to displace the aperture image plane with respect to the substrate surface so that the sharp edged spot is slightly out of focus.

For mesh type ground plane structures consisting of wide grooves, care has to be exercised to maintain constant depth at the intersections of the grooves. This is achieved by careful control of the laser pulse energies and the on time of any laser beam as it crosses an existing groove. For mesh type ground plane structures consisting of touching pads, care has to be exercised to maintain constant depth at the intersections of the pads. This is achieved by careful control of the laser pulse energy and the laser firing time.

The control system used needs to be able to co-ordinate the motion of the 2-axis scanner with the motorized aperture, together with the power and triggering controls of both laser types. Such control systems are commonly used in the laser marking and micro-machining industries.

All the discussions above have concerned the use of a single scanner and lens to deliver the beams alternately to the substrate. In practice, to increase process rate, it is likely that several optical channels will be used in parallel. With sufficient laser power available from both lasers, it is possible to split the beam after the combination point such that two or more scanners and lenses can operate in parallel and process different devices on the same circuit board at the same time. After these devices have been completed, the substrate is stepped to a new location so that further devices can be processed. Operation over a large panel having multiple devices is thus in "step and scan" mode. Clearly, devices processed in parallel using the same lasers at the same time like this must have the same circuit features.

Most circuit boards using this embedded conductor technology are constructed on a core layer with layers of different electrical circuits built up on opposite sides. The methods disclosed herein can be readily extended to this situation to allow simultaneous processing of different circuits on opposite sides of the same device at the same time. In this case, separate optical assemblies consisting of first and second lasers, aperture, beam shaping optics, combining mirror, scanner and lens are required for each of the two sides of the circuit board so that different circuit designs on opposite sides can be realized. A production laser tool for the high speed manufacture of multiple, multilayer, dual sided devices based on embedded conductor technology might consist of two or more scanner and lens systems operating on one side of the circuit board and an identical combination of lasers and optics operating on the opposite side at the same time.

Other preferred and optional features will be apparent from the following description and from the subsidiary claims of the specification.

BRIEF DESCRIPTION OF DRAWINGS

The invention will now be further described, by exemplary embodiments that will now be described with reference to the accompanying drawings of which.

DETAILED DESCRIPTION OF EMBODIMENTS SHOWN IN THE DRAWINGS

FIG. 1

Figure 1:
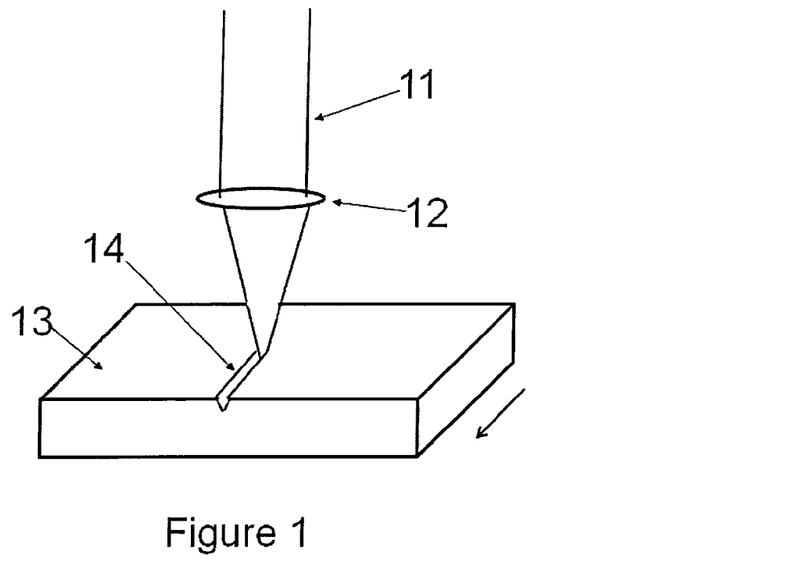
FIG. 1 is a schematic diagram showing how grooves are made in a substrate surface with a focused beam from a laser.

FIG. 1 illustrates a process whereby a first laser beam is used to create fine grooves in the surface of a substrate 13. Laser beam 11 is of high quality having diffraction limited or close to diffraction limited properties. Lens 12 focuses the laser beam onto the surface of the substrate 13 to create a small spot. The energy absorbed causes the substrate material in the region of the focal spot to be vaporized. The laser beam is moved over the substrate surface so that a groove 14 is formed. A straight groove 14 is shown in the figure but in practice grooves can be of any shape set by the motion of the beam with respect to the substrate 13. Grooves can be of any length set by the limits of the mechanism that moves the beam with respect to the substrate. If the laser used is of CW type, then the depth of groove formed will be of uniform depth along its length so long as the laser power, beam size and speed are held constant. If the laser used is of pulsed type, then to maintain uniform groove depth along its length the repetition rate must be sufficiently high that the distance traveled by the beam over the substrate between pulses is substantially less than the groove width.

FIG. 2

Figure 2A:
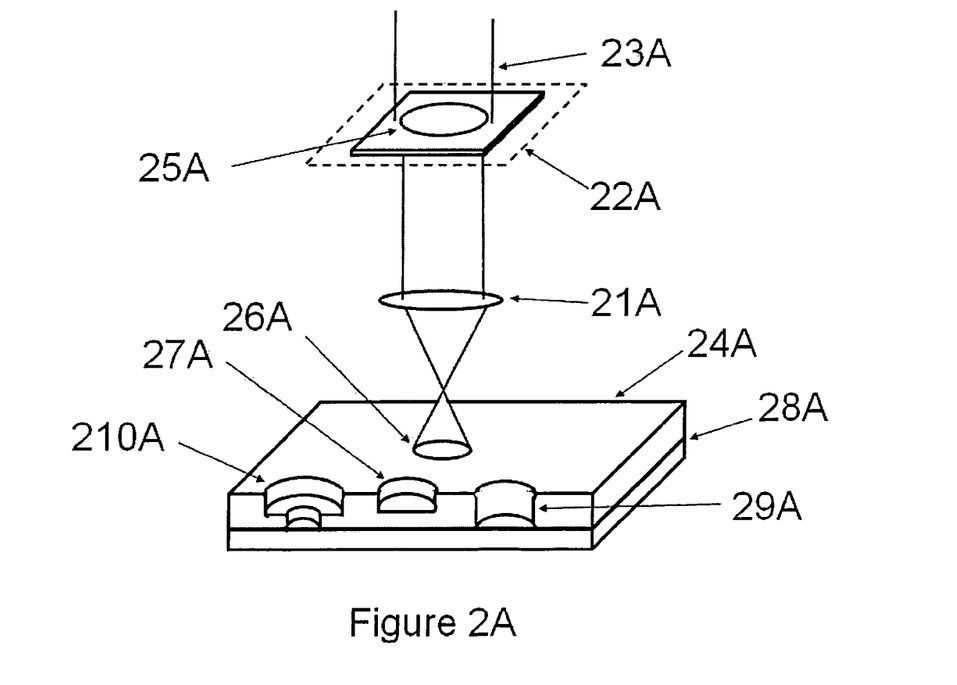
FIGS. 2A and 2B are schematic diagrams showing how pads and contact holes are made in the substrate with a laser beam operating in imaging mode and with focal spot shaping, respectively.

FIG. 2A illustrates the process whereby a second laser beam 23A is used to create larger scale pads or contact holes in the surface of a substrate 24A. Lens 21A is used to image an object plane 22A in the laser beam 23A onto the surface of the substrate 24A. In the case shown, a circular aperture 25A is situated at the object plane 22A so that a circular spot 26A is formed on the substrate surface 27A. The laser beam is held stationary with respect to the substrate and a burst of pulses is fired. The laser energy absorbed during each laser pulse causes the substrate material in the image area to be vaporized to a certain depth. The cumulative effect of the burst of pulses is that a blind hole 27A of defined depth is drilled into the substrate surface. Such a blind hole 27A in the substrate material is termed a pad. The substrate may well be of polymer type containing a buried metal layer 28A and in this case, if the energy density in the laser pulses is well controlled, the drilling process generally stops when the laser beam penetrates to the metal 28A. Such a blind hole 29A connecting to a lower metal layer 28A is termed a contact hole. In some cases, it may be desirable to have a contact hole in the centre of a pad 210A. This can be achieved in two ways. In one case, the pad is formed by firing a suitable number of, laser pulses with an appropriate aperture in the beam. The aperture is then changed to a smaller one and further pulses are fired to remove material down to the buried metal layer 28A. In another case, a single mask that has two or more different areas having different levels of optical transmission at the wavelength of the second laser beam is used. Such a method causes the energy density in the laser spot on the substrate surface to have different levels in different areas so that after several laser pulses have been fired the areas where the energy density is higher are deeper than the areas subjected to lower energy density pulses. In the case shown in the figure, the central area of the mask has high transmission and an outer annular region has lower transmission. Masks with such transmission variations are well known and are readily available.

Figure 2B:
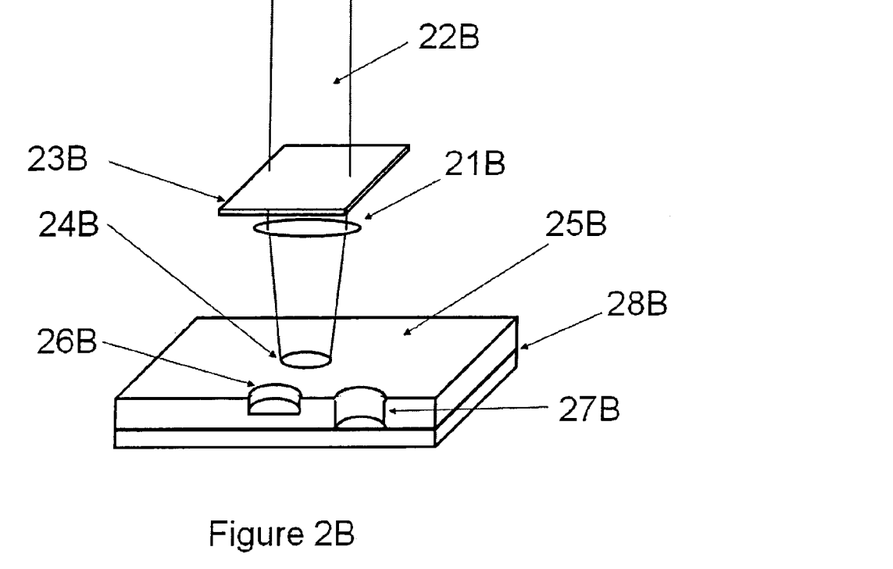

FIG. 2B is similar to FIG. 2A but shows how larger scale features, such as pads and holes, can be formed by focal spot shaping of the second laser beam 22B rather than via an aperture or mask. The beam 22B is passed through a beam shaper 23B, such as a diffractive optical element (DOE) and then passes through a lens 21B. The beam shaper introduces angular deviations into the beam path so as to form a shaped focal spot 24B on the surface of the substrate 25B. Typically, the focal spot 24B is circular (although may be of other shape) with a top-hat energy density profile. The size of the focal spot 24B is much larger than would be formed without the use of a DOE.

The edge sharpness of the focal spot 24B depends on the quality of the laser beam 22B. It is preferred for the beam to be focusable (eg M2~1) so the spot 24B has a sharp edge. If the beam is multimode (MM) the sharpness of the edge of the spot 24B deteriorates (in this case it would be better to use the imaging method illustrated in FIG. 2A).

FIG. 2B shows a pad 26B formed by ablation part way through the depth of the polymer layer 25B and via or pad 27B formed by pulsed laser ablation of the polymer layer 25B through to a buried metal layer 28B.

FIG. 3

Figure 3:
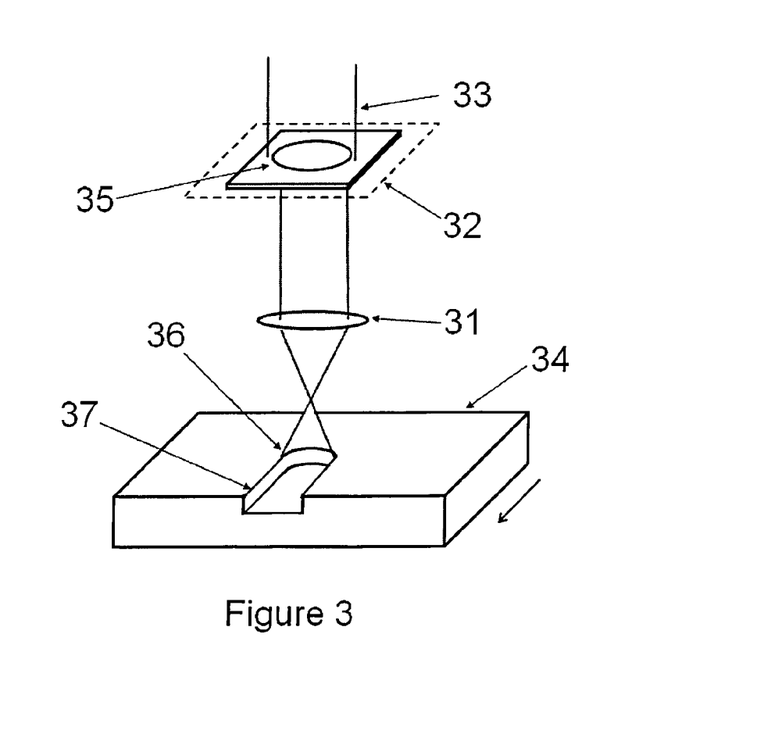
FIG. 3 is a schematic diagram showing how wide grooves are made in the substrate with a laser beam operating in imaging mode.

FIG. 3 is similar to FIG. 2B and illustrates the process whereby a second laser beam is used to create relatively wide grooves or areas in the surface of a substrate 34. Lens 31 is used to image an object plane 32 in the laser beam 33 onto the surface of the substrate 34. In the case shown, a circular aperture 35 is situated at the object plane so that a circular spot 36 is formed on the substrate surface. The laser beam 33 is moved with respect to the substrate 34 and a series of laser pulses is fired. The laser energy absorbed during each laser pulse causes the substrate material in the image area to be vaporized to a certain depth that is less than the required depth of the groove 37. The speed of relative motion of the laser beam 33 and the substrate 34 and the firing rate of the laser pulses are controlled such that each area of the substrate is exposed to a sufficient number of pulses to form a continuous wide groove 37 with the required depth. A straight groove 37 is shown in the figure but in practice grooves can be of any shape set by the motion of the beam with respect to the substrate. Grooves can be of any length set by the limits of the mechanism that moves the beam with respect to the substrate. Grooves can be formed in a similar manner using the focal spot shaping apparatus shown in FIG. 2B.

FIG. 4

Figure 4:
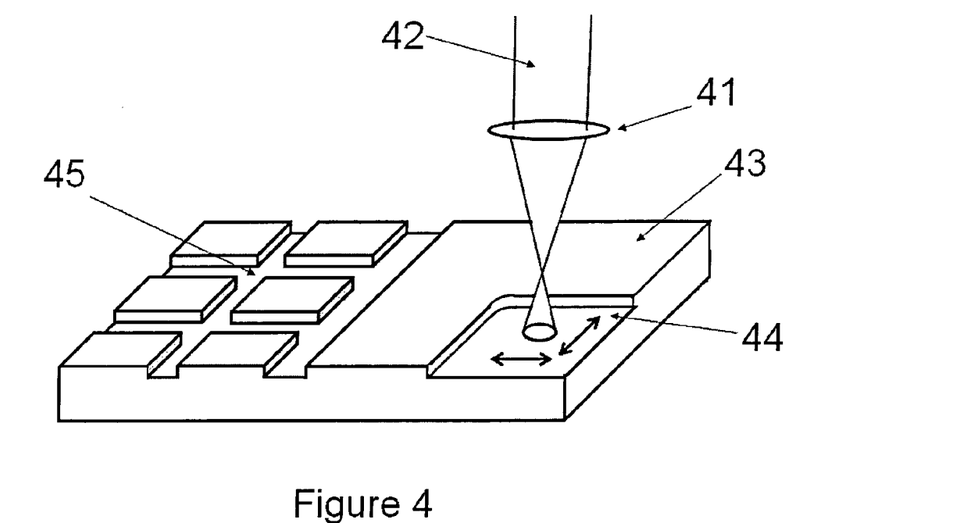
FIG. 4 is a schematic diagram showing how shallow mesh and continuous area ground plane structures are made in the substrate with a laser beam operating in imaging mode.

FIG. 4 illustrates the process whereby a second laser beam 42 is used to create mesh-type and continuous-area, shallow ground plane structures in the surface of a substrate 43. Lens 41 is used to image an object plane in the laser beam 42 onto the surface of a substrate 42. The laser beam is moved along with respect to the substrate 43 and a series of laser pulses is fired. By moving the beam and the substrate 43 in a controlled way along 2 orthogonal axes, such that laser pulses overlap in both axes, substrate material is ablated to a controlled depth over a large continuous area 44. Alternatively, a shallow mesh type structure 45 is formed by the crossing of a series of wide grooves. When forming continuous or mesh type structures, care has to be taken to maintain the depth constant within some defined limit. This is achieved by control of the laser pulse energy density, beam speed and firing time of the pulses. Similar structures can be formed in a similar manner using the focal spot shaping apparatus shown in FIG. 2B.

FIG. 5

Figure 5:
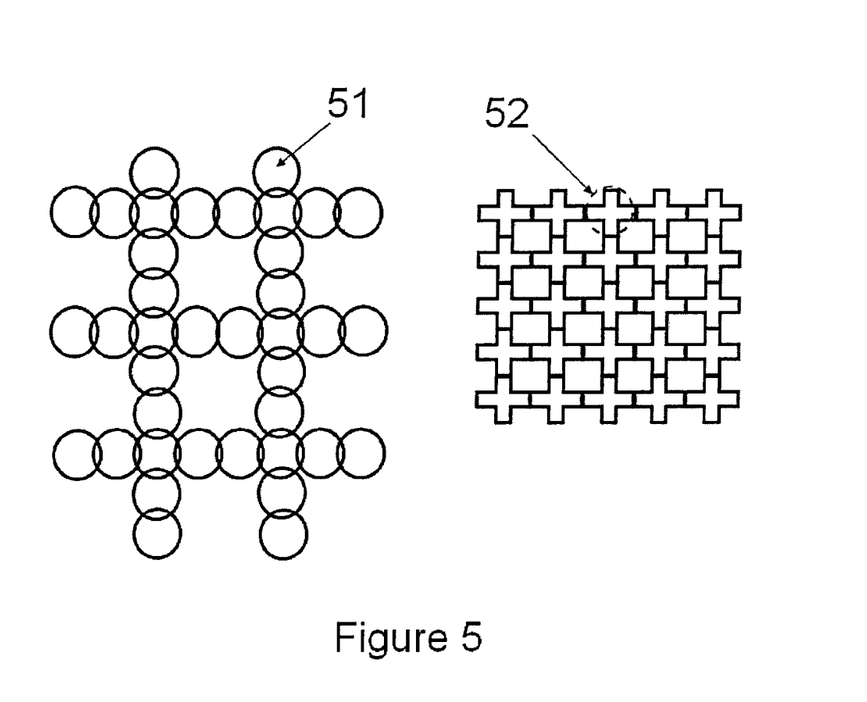
FIG. 5 illustrates alternative methods for making mesh type ground plane structures.

FIG. 5 shows two alternative ways in which a second laser beam can be used in imaging mode to create shallow 2D mesh-type ground plane structures in the surface of a substrate. In one case shown, a mesh structure consisting of a pattern of touching pads 51 is formed. In another case shown, a mesh structure consisting of a pattern of touching cross type structures 52 is formed. Such a structure can be created by placing a suitable mask in the beam and imaging the mask pattern onto the substrate. The beam is moved continuously over the substrate with the laser pulses being fired at the times that correspond to the required positions of the pads or crosses in order to make the boundaries touch. Several laser pulses are generally required at each position to remove material to the required depth so for this to be achieved the pattern is repeated multiple times. Many other mask shapes can be used to create meshes of different structure. When forming mesh type structures by this method, care has to be taken to maintain the depth constant within some defined limit in the region of overlap of individual round pads or other shape laser spots. This is achieved by control of the laser pulse energy density, the beam speed and the firing time of the pulses as well as the energy density profile at the spot edge and the degree of overlap between spots. A spot energy density profile with a soft edge is preferable in this case. Similar structures can also be formed in this matter using the focal spot apparatus shown in FIG. 2B.

FIG. 6

Figure 6A:
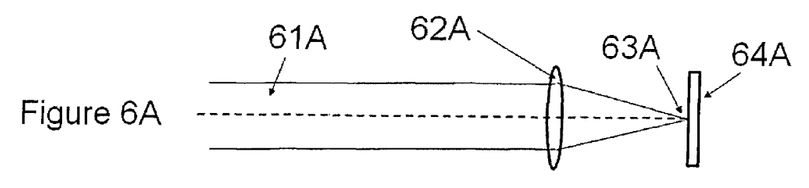
FIGS. 6A, 6B and 6C are schematic diagrams showing the typical optical systems used for the processes described.
Figure 6B:
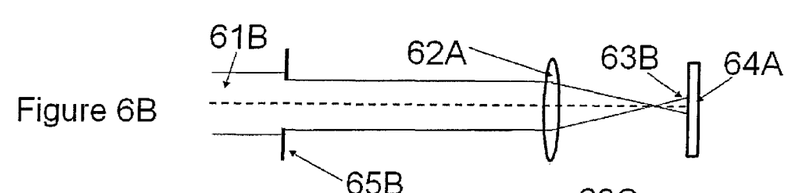

FIGS. 6A and 6B illustrate optical systems in which two separate lasers are used for the two processes described. First CW laser beam 61A is focussed by lens 62A to a focal spot 63A on substrate 64A. Second pulsed laser beam 61B passes through an aperture or mask 65B and an image 63B of the mask 65B is formed on the substrate 64A by lens 62A. The two laser beams 61A and 61B are combined (not shown) into a common optical path. The common optical path comprises the lens 62A which directs the laser beams onto the substrate 64A.

Figure 6C:
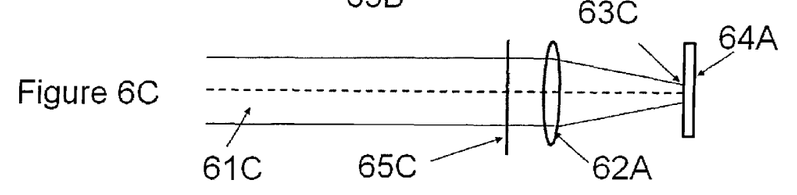

Alternatively, in another embodiment, the optical systems illustrated in FIGS. 6A and 6C are used. FIG. 6C shows a pulsed laser beam 61C which is passed through a beam shaper 65C and then through lens 62A in the common optical path to form a shaped focal spot 63C on, the substrate 64A.

A beam size changing telescope (not shown) may be provided in the laser beams 61A, 61B to set the beam size to give (in FIG. 6A) the required focal spot size at the lens focal plane and to adjust (in FIG. 6B) the beam size to match the aperture 65B. An optics unit (not shown) may also be provided after the aperture 65B in the form of a long focal length telescope which is set so that a reduced image of the aperture 65B is situated in the focal plane of the lens 62A. Such an imaging arrangement is well know and is often termed "infinity" imaging since the image occurs in the lens focal plane and hence the corresponding object plane is at infinity. With this arrangement of the optical systems, the distance from the substrate to the lens can be maintained constant during the switch from one process to the other which is very convenient.

FIG. 7

Figure 7A:
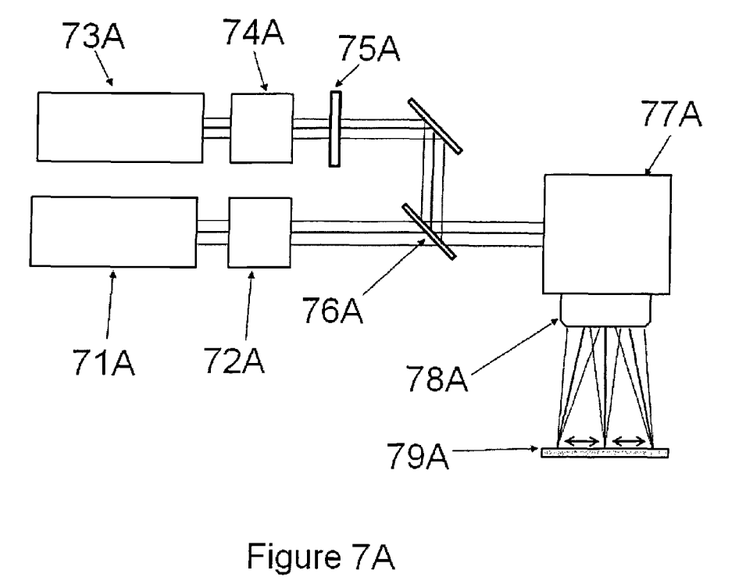
FIGS. 7A and 7B are schematic diagrams of two arrangements showing how the beams from two different lasers are combined into a common beam path and moved over the substrate surface to sequentially create grooves and pads or contact holes.

FIG. 7A shows an embodiment in which two different lasers are used to generate the two beams required for the two different processes. The beams are combined and thereafter propagate through a common beam path consisting of a beam deflection system and a lens. Laser 71A generates a first beam that is of high quality and operates CW or with high repetition rate such that it is suitable for the grooving process. Optics unit 72A changes the laser beam size to a value that is appropriate for propagation into the common beam path. Laser 73A generates a second beam that is pulsed and is either multimode (MM) or has M2~1 that is suitable for pad and contact hole drilling and for the formation of shallow mesh type or continuous area ground plane structures. Optics unit 74A changes the laser beam size to a value that is appropriate for illumination of an aperture 75A. Both first and second beams are combined at a mirror 76A that is either switched in an out of the beam path to allow either the first or second beams into the common beam path or, alternatively, remains in position and reflects preferentially a beam of one polarization and transmits preferentially a beam of the orthogonal polarization. In this case, the first and second beams are arranged to have orthogonal polarizations at the beam combining, mirror 76A. In the case shown, the first beam passes through the mirror 76A and therefore it is desirable that it has a polarization direction in the plane of the paper (so called p-polarization). The second beam is reflected from the mirror 76A and therefore it is desirable that it has a polarization direction that is perpendicular to the paper surface (so called s-polarization). Such techniques for combining beams of different polarization are well known. After beam combination, the two beams pass to a 2 or 3 axis scanner unit 77A and a lens 78A, e.g. an f-theta lens. In some cases, it may be desirable to place the lens 78A before the scanner unit 77A. The scanner 77A allows movement of the beams over the process area on the substrate 79A. The lens 78A has the function of alternately focussing the first beam and imaging the aperture in the second beam onto the substrate surface 79A. To avoid distance changes between the lens 78A and the substrate 79A as the system switches from the first grooving process to the second pad or contact hole forming process, additional optics (not shown) can be placed in the path of the second beam after the aperture 75A. Such optics 710 are generally of telescopic type with the aperture 75A situated at the effective focus and the ratio of the effective focal length of the telescope 710 to the focal length of the lens 78A before the substrate 79A is chosen to create a de-magnified image of the aperture 75A of the correct size on the substrate surface 79A. Such methods for imaging masks or apertures in laser beams are very well known.

Figure 7B:
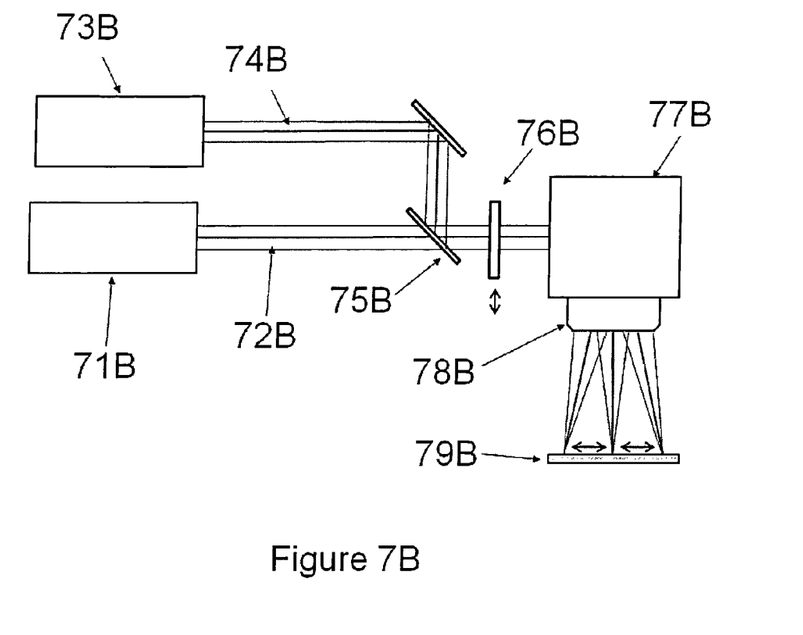

FIG. 7B shows an embodiment in which two different lasers are used to generate the two beams required for the two different purposes. In this case, laser 71B generates a first beam 72B that is of high quality and operates CW or with a high repetition rate for the grooving process. The first beam 72B passes through combining or switch mirror 75B to a scanner unit 86A and is focussed by a lens 78B onto a substrate 79B. Second laser 73B emits a pulsed laser beam 74B (e.g. with M2~1) for pad and contact hole drilling. The second laser beam 74B is reflected by combining or switch mirror 75B to the scanner 77B and hence through lens 78B (e.g. of f-theta type) to form a focal spot on substrate 79B. When the second laser beam 74B is operating, a moveable beam shaper, such as a diffractive optical element 76B, is inserted in the beam path between the mirror 75B and scanner unit 77B.

FIG. 8

Figure 8A:
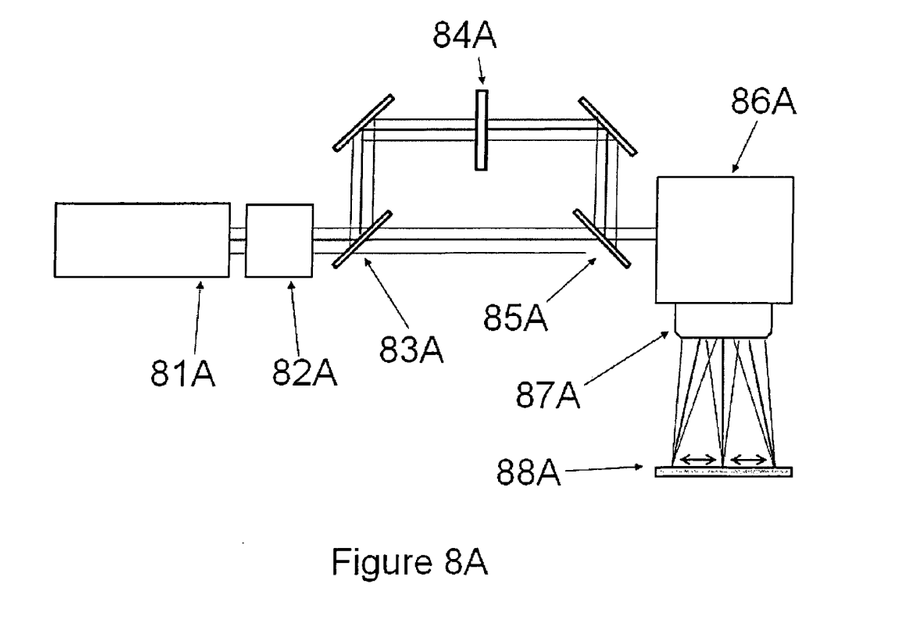
FIGS. 8A and 8B are schematic diagrams showing two arrangements of how a single laser can be used in both focussed mode and imaged mode to sequentially create grooves and pads or contact holes in the surface of the substrate.

FIG. 8A shows another embodiment of this invention in which a single laser 81A is used to generate the two beams required for the two different processes. To form grooves, laser 81A generates a first beam that is of high quality and operates CW or with a high repetition rate such that it is suitable for the grooving process. Optics unit 82A changes the laser beam size to a value that is appropriate for propagation into the common beam path in order to generate the correct size of focal spot. The first laser beam passes through a separating or switch mirror 83A and passes through a combining or switch mirror 85A to the common optical path. The common optical path consists of a scanner unit 86A and a lens 87A e.g. an f-theta type which focuses the first beam onto the substrate 88A.

To form pads or contact holes or create shallow mesh or continuous area ground plane structures, the operation of the laser 81A is changed to pulsed mode such that it is suitable for the imaged spot drilling process. In this case, the second laser beam is deviated by combining or switch mirror 83A into an optical path which passes through a mask or aperture 84A and is then deviated by combining or switch mirror 85A into the common optical path. The distance between, the lens 87A and the substrate 88A may be changed between the two processes to switch between focussed beam grooving and imaged beam drilling. Alternatively, telescopic type optics (not shown) may be moved into the beam path to allow both processes to occur with constant distance between lens 87A and substrate 88A. In some cases, it may be desirable to replace or supplement the beam shaping optics used for the grooving process with other optics (not shown) to condition the laser beam to match the aperture 84A.

Figure 8B:
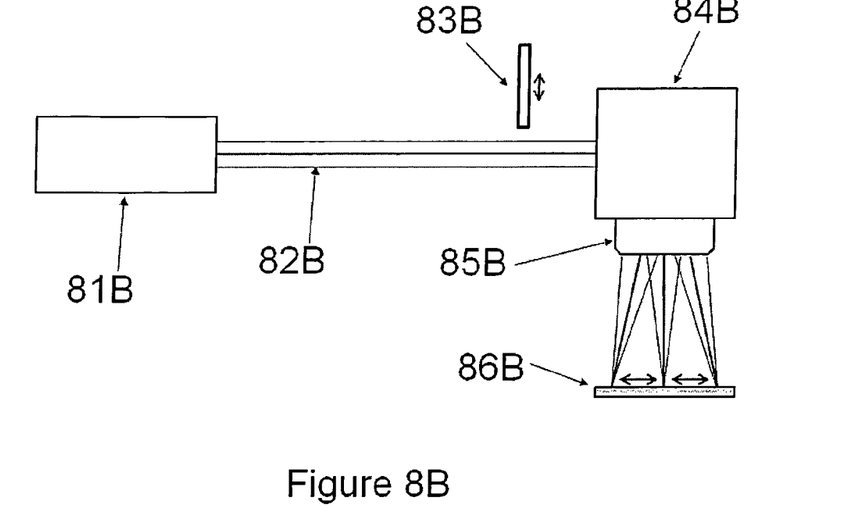

FIG. 8B shows another embodiment in which a single laser 81B is used to generate the two beams required for the two different processes. In this case, instead of deviating the beams as in FIG. 8A, a diffractive optical element (DOE) 83B is moved into and out of the beam path. When the first CW or QCW beam is produced, this passes directly to the common optics comprising scanner 84B and lens 85B (typically an f-theta lens) onto a substrate 86B. When the second, pulsed laser beam is produced, the DOE 83B is inserted into the beam so the beam passes through this before entering the common optics.

FIG. 9

Figure 9:
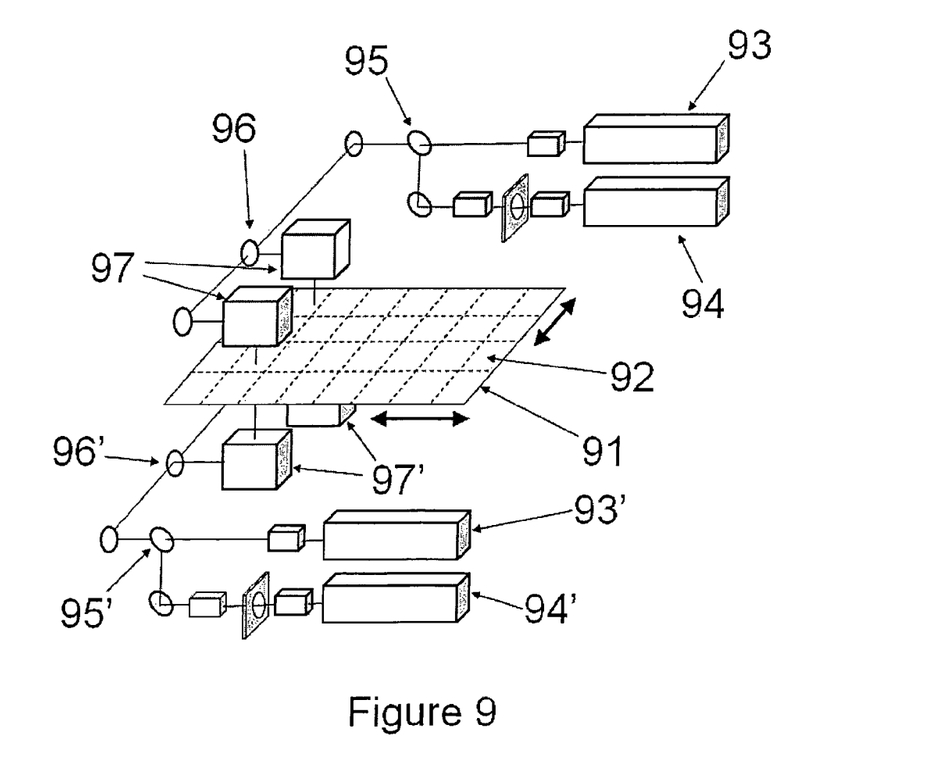
FIG. 9 is a schematic perspective view showing an example of an apparatus used to perform the two processes on a double sided circuit board.

FIG. 9 shows an embodiment of this invention comprising apparatus that is appropriate for performing a dual laser process on a double sided circuit board 91 containing multiple repeating devices 92 on each board. Lasers 93 and 93' that are of the same type generate two first beams for the top and bottom side grooving processes, respectively. Other lasers 94 and 94', that are also of the same type, which is different to the type of the first lasers, generate two second beams for top and bottom side pad and contact hole drilling and for the formation of shallow mesh type or continuous area ground planes, respectively. Lasers 93 and 94 operate alternately on the top side circuits while lasers 93' and 94' operate alternately on the lower side circuits. In this manner, the circuits created on the top and bottom sides can be different. First and second laser beams are sequentially injected into the common paths via mirrors 95 and 95'. The top and bottom common optical paths each contain beam splitters 96 and 96' to divide the beams into two in order to feed two parallel scanner and lens units 97 and 97' that operate simultaneously on the devices on the circuit board. The two scanners on the top side process two devices at the same time with one design of circuit while the two scanners on the lower side process the opposite sides of the two devices with the same or a different circuit design. With sufficiently high power lasers, division of the beams on the top and bottom sides into more than two parallel channels is possible.

As indicated above, the formation of narrow grooves and wider areas and/or holes in the surface of a dielectric layer is of particular use in the manufacture of micro-electronic circuits, the grooves and holes being filled with metal in a subsequent metal plating process to form a complex pattern of fine conductors, pads and micro-vias.

The invention described above thus provides a method for the formation of fine grooves, blind pads and contact holes in the surface of a polymer layer on a substrate by means of two different laser processes which are sequentially applied to the substrate, the fine grooves being connected to the blind pads and contact holes, said method comprising:

a. a first laser beam that is strongly absorbed by the polymer layer on the substrate and has diffraction limited or close to diffraction limited beam quality and operates either continuously or in a series of pulses at high repetition rate.

b. a second laser beam that has the same wavelength as the first laser beam and operates in pulsed mode emitting bursts of pulses c. a method for combining or interchangeably injecting the first and second laser beams into a common optical path d. a beam scanner system in the common optical path for alternately deflecting either the first or second laser beams in two orthogonal axes e. a lens in the common optical path which is used alternately for focussing the first laser beam onto the surface of the polymer layer or for forming an image on the surface of the polymer layer of a defined object plane in the second laser beam path that object plane being outside the common optical path f. a control system that:—
  i. firstly causes the first laser beam to be injected into the common optical path and drives the scanner system such that the focussed spot formed by the lens on the surface of the polymer layer makes a series of continuous moves over an area in order to vaporize the polymer material to form grooves in the surface that have a depth that is only a fraction of the thickness of the polymer layer and
  ii. secondly causes the second laser beam to be injected into the common optical path and drives the scanner system such that the image of the defined object plane in the second laser beam path formed by the lens on the surface of the polymer layer is moved to a series of defined locations within the area of the substrate containing the grooves formed by the first laser beam and at each location the second laser beam is held stationary and a burst of laser pulses of sufficient number and energy is fired such that the polymer material is vaporized to form blind holes of defined depth the depth of some holes (so called pads) being less than the full thickness of the polymer layer and equal to the depth of the grooves formed by the first laser beam and the depth of other holes extending right through the polymer layer to an underlying metal layer.

The invention claimed is:

1. Apparatus for the formation by laser ablation of relatively narrow grooves and relatively wide areas and/or holes in the surface of a dielectric layer comprising:

laser apparatus for providing a first laser beam that is strongly absorbed by the dielectric layer and has substantially diffraction limited beam quality and which operates continuously or quasi-continuously for direct writing of the grooves and a second laser beam that is strongly absorbed by the dielectric layer and which operates in pulsed mode for forming the areas and/or holes via an image of an aperture or mask or via focal spot shaping;

a common optical path comprising a beam scanner for deflecting the first and second laser beams in two orthogonal axes relative to the dielectric layer and a lens for focusing the first laser beam onto the surface of the dielectric layer and, when the second laser beam is used, for forming an image of said aperture or mask on the surface of the dielectric layer or for forming a shaped focal spot on the surface of the dielectric layer;

and a control system arranged, in a first step, to drive the beam scanner so that a focused spot of the first laser beam is moved so as to vaporize the dielectric material to form relatively narrow grooves in the surface thereof and, in a second step, to drive the beam scanner so that a relatively wide laser spot from the second laser beam is incident on the surface of the dielectric layer and is moved to form relatively wide areas of defined depth in the surface thereof and/or is moved between a series of defined locations and the second laser beam held stationary at each location and a burst of laser pulses of sufficient number and energy is fired such that the dielectric material is vaporized to form a relatively wide hole of defined depth.

2. Apparatus as claimed in claim 1 in which the laser apparatus comprises different lasers for generating the first and second laser beams.

3. Apparatus as claimed in claim 2 in which the laser that generates the second laser beam is a multimode laser.

4. Apparatus as claimed in claim 1 in which the laser apparatus is arranged to provide the first laser beam in pulsed mode with a repetition rate exceeding 300 kHz.

5. Apparatus as claimed in claim 1 in which the laser apparatus is arranged to provide the second laser beam with an energy in each pulse that exceeds 100 µJ.

6. Apparatus as claimed in claim 1 in which the laser apparatus is arranged to provide the first and second laser beams with a wavelength in the range 250 to 1100 nm, the first or second laser beams being either of the same or different wavelength.

7. A method of forming relatively narrow grooves and relatively wide areas and/or holes in the surface of a dielectric layer by laser ablation comprising:

providing a first laser beam that is strongly absorbed by the dielectric layer and has substantially diffraction limited beam quality and which operates continuously or quasi-continuously to directly write the grooves and providing a second laser beam that is strongly absorbed by the dielectric layer and which operates in pulsed mode to form the areas and/or holes via an image of an aperture or mask or via focal spot shaping;

providing a common optical path comprising a beam scanner to deflect the first and second laser beams in two orthogonal axes relative to the dielectric layer and a lens to focus the first laser beam onto the surface of the dielectric layer and, when the second laser beam is used, to follu an image of said aperture or mask on the surface of the dielectric layer or to form a shaped focal spot on the surface of the dielectric layer;

and providing a control system which, in a first step, drives the beam scanner so that a focused spot of the first laser beam is moved so as to vaporize the dielectric material to form relatively narrow grooves in the surface thereof and, in a second step, drives the beam scanner so that a relatively wide laser spot from the second laser beam is incident on the surface of the dielectric layer and is moved to form relatively wide areas of defined depth in the surface thereof and/or is moved between a series of defined locations, the second laser beam being held stationary at each location and a burst of laser pulses of sufficient number and energy is fired such that the dielectric material is vaporized to form a relatively wide hole of defined depth.

8. A method as in claim 7 in which the second laser beam forms an image on the surface of the dielectric layer of an aperture positioned co-axial with the second laser beam.

9. A method as in claim 8 in which said aperture is circular and the diameter of the aperture can be varied, whereby the diameter of the area or hole formed in the dielectric layer by the second laser beam can be adjusted.

10. A method as in claim 9 in which the diameter of the circular aperture is varied under control of the control system so that the diameter of the areas or holes formed in the dielectric layer can be changed rapidly.

11. A method as in claim 9 in which said aperture in the second laser beam has a shape that is other than circular in order to form a hole of non-circular shape in the dielectric layer.

12. A method as in claim 7 in which the second laser beam forms an image on the surface of the dielectric layer of a circular mask positioned co-axial with the second laser beam, the mask having two or more areas having different levels of optical transmission at the wavelength of the second laser beam.

13. A method as in claim 12 in which the mask is circular and has a central region with high optical transmission at the wavelength of the second laser beam and an outer region where the optical transmission decreases smoothly with radius to a negligible value.

14. A method as claimed in claim 7 in which the shaped focal spot of the second laser beam is formed on the surface of the dielectric layer by means of a diffractive optical element positioned in the second laser beam.

15. A method as claimed in claim 14 in which different diffractive optical elements are placed in the second laser beam to form different sizes of shaped focal spot on the surface of the dielectric layer.

16. A method as claimed in claim 7 in which the dielectric layer is either a homogeneous organic material or an organic material loaded with inorganic particles.

17. A method as in claim 7 in which the grooves created by the first laser beam have a width less than 0.1 mm and in which the area or holes created by the second laser beam have a width greater than 0.1 mm.

18. A method as in claim 7 in which the grooves created by the first laser beam have a width less than 0.02 mm and in which the holes or areas created by the second laser beam have a width greater than 0.02 mm.

19. A method as in claim 7 in which the beam scanner moves the second laser beam over an area on the surface of the dielectric layer so as to form relatively wide grooves, continuous structures or structures consisting of crossing grooves or overlapping holes that have a depth that is less than the thickness of the dielectric layer.

20. A method as claimed in claim 7 in which the first and second laser beams each have a wavelength in the range 250 to 1100 nm.

* * * * *